US009035408B2

(12) United States Patent
Boudreau et al.

(10) Patent No.: US 9,035,408 B2
(45) Date of Patent: May 19, 2015

(54) NANOMETER-SCALE LEVEL STRUCTURES AND FABRICATION METHOD FOR DIGITAL ETCHING OF NANOMETER-SCALE LEVEL STRUCTURES

(71) Applicants: Andrew J. Boudreau, Washington, DC (US); Michael K. Yetzbacher, Burke, VA (US); Marc Christophersen, Berwyn Heights, MD (US); Bernard F. Phlips, Great Falls, VA (US)

(72) Inventors: Andrew J. Boudreau, Washington, DC (US); Michael K. Yetzbacher, Burke, VA (US); Marc Christophersen, Berwyn Heights, MD (US); Bernard F. Phlips, Great Falls, VA (US)

(73) Assignee: The United States of America, as represented by the Secretary of the Navy, Washington, DC (US)

( * ) Notice: Subject to any disclaimer, the term of this patent is extended or adjusted under 35 U.S.C. 154(b) by 0 days.

(21) Appl. No.: 14/269,292

(22) Filed: May 5, 2014

(65) Prior Publication Data

US 2014/0327099 A1    Nov. 6, 2014

Related U.S. Application Data

(60) Provisional application No. 61/819,767, filed on May 6, 2013.

(51) Int. Cl.
*H01L 27/146* (2006.01)
(52) U.S. Cl.
CPC .... *H01L 27/14629* (2013.01); *H01L 27/14685* (2013.01); *H01L 27/14601* (2013.01); *H01L 27/14683* (2013.01)

(58) Field of Classification Search
None
See application file for complete search history.

(56) References Cited

U.S. PATENT DOCUMENTS 7,907,340 B2 *    3/2011    Wang et al. .................. 359/587

OTHER PUBLICATIONS

Tack, Nicolaas et al., A Compact, High-speed and Low-cost Hyperspectral Imager, Silcon Photonics VII, Proc. of SPIE, Feb. 28, 2012, pp. 8266DQ1-8266DQ13, vol. 8266, SPIE. USA.
Wang, Shao-Wei et al., Concept of a high-resolution miniature spectrometer using an integrated filter array, Optics Letters, Mar. 15, 2007, pp. 632-634, vol. 32, No. 6, Optical Society of America, USA.
Emadi, Arvin et al., Fabrication and characterization of IC-Compatible Linear Variable Optical Filters with application in a microspectrometer, Sensors and Actuators A: Physical, May 7, 2010, pp. 400-405, vol. 162, Elsevier, Netherlands.

(Continued)

*Primary Examiner* — Matthew Reames
*Assistant Examiner* — Joseph Schoenholtz
(74) *Attorney, Agent, or Firm* — US Naval Research Laboratory; Suresh Koshy (57) ABSTRACT

A ramped etalon cavity structure and a method of fabricating same. A bi-layer stack is deposited on a substrate. The bi-layer stack includes a plurality of bi-layers. Each bi-layer of the plurality of bi-layers includes an etch stop layer and a bulk layer. A three dimensional photoresist structure is formed by using gray-tone lithography. The three dimensional photoresist is plasma etched into the bi-layer stack, thereby generating an etched bi-layer stack. The etched bi-layer stack is chemically etched with a first chemical etchant to generate a multiple-step structure on the substrate, wherein the first chemical etchant stops at the etch stop layer.

20 Claims, 9 Drawing Sheets

(56) References Cited

OTHER PUBLICATIONS

Sabatyan, Arash et al., Study of a novel and simple method of generating binary mask for microprism fabrication, Appiied Optics, Feb. 2, 2012, pp. 525-530, Optical Society of America, USA.

Chistophersen, Marc et al., Gray-tone lithography using an optical diffuser and a contact aligner, Applied Physics Letters, May 13, 2008, pp. 194102-1-194102-3, vol. 92, AIP Publishing, USA.

\* cited by examiner

NANOMETER-SCALE LEVEL STRUCTURES AND FABRICATION METHOD FOR DIGITAL ETCHING OF NANOMETER-SCALE LEVEL STRUCTURES

CROSS-REFERENCE TO RELATED APPLICATIONS

This application claims priority to U.S. Provisional Patent Application Ser. No. 61/819,767, entitled "FABRICATION METHOD FOR DIGITAL ETCHING OF NANOMETER-SCALE LEVEL STRUCTURES," to Boudreau et al., which was filed on 6 May 2013 and is incorporated herein by reference.

BACKGROUND OF THE INVENTION

1. Field of the Invention

This invention relates in general to an integrated optical device and method for manufacturing same, and in particular to an integrated optical device having multiple nanometer-scale level structures and method for manufacturing same.

2. Description of the Related Art

Conventional spectrometers typically use dispersive elements to separate light into its spectral components, requiring space and precise alignment of delivery optics. The requirement of holding imaging optics and dispersive optics in precise alignments adds substantially to the size, weight, and assembly costs of optical systems. The size, weight and cost of spectrometers can be reduced by building an integrated optical device on the image sensor. Such an integrated system has further advantages relative to a grating spectrometer in its robust alignment and its sensitivity.

Several types of integrated spectrometers have been demonstrated by using micro-scale Fabry-Perot etalons. A Fabry-Perot etalon is typically made of a transparent medium bounded by two reflecting surfaces to create an optical cavity. The transmission spectrum of the cavity exhibits peaks of transmission corresponding to resonances of the optical cavity. The position of resonances depends very sensitively on the cavity length and the index of the material in the cavity. Required tolerances for cavity length can be of nanometer order, making fabrication challenging.

The standard way to micro-fabricate optically flat steps with nanometer-scale height control is to sequentially etch levels into a dielectric material. Each level is done in a single lithographic and subsequent etching step. There are ways to reduce the number of process steps, such as "combinatorial etching." Essentially, one needs to perform a square-root of micro-fabrication steps for the overall step amount. Even this approach leaves ~31 micro-fabrication steps for a structure with 1,000 levels. Because each micro-fabrication step is time consuming and adds costs, minimizing the amount of fabrication steps is desired. For comparison, a typical commercial chip, depending on its complexity, requires 8-32 lithography steps. The resulting fabrication of a 1,000 level structure by digital etching is quite an effort. Other approaches use grey-scale lithography to fabricate steps in a single lithograph step, but the variability of etch processes and material homogeneity usually limit the number of truly distinct levels to around 100-400 levels.

BRIEF SUMMARY OF THE INVENTION

An embodiment of the invention includes a method of fabricating a multiple-step structure on a substrate. A bi-layer stack is deposited on a substrate. The bi-layer stack includes a plurality of bi-layers. Each bi-layer of the plurality of bi-layers includes an etch stop layer and a bulk layer. A three dimensional photoresist structure is formed by using gray-tone lithography. The three dimensional photoresist is plasma etched into the bi-layer stack, thereby generating an etched bi-layer stack. The etched bi-layer stack is chemically etched with a first chemical etchant to generate a multiple-step structure on the substrate, wherein the first chemical etchant stops at the etch stop layer.

Optionally, the etch stop layer comprises alumina, and the bulk layer comprises silicon dioxide.

Optionally, the first chemical etchant comprises vaporous hydrofluoric acid.

Optionally, plasma etching the three dimensional photoresist into the bi-layer stack uses fluorine-based plasma chemistry.

Optionally, the multiple-step structure comprises a number of individual steps, the number of individual steps being larger than twenty.

Optionally, the substrate is a semiconductor with integrated circuits. Optionally, the semiconductor is an imager.

Optionally, the substrate is a focal plane array comprising a plurality of sensor nodes.

Optionally, depositing a bi-layer stack includes depositing the plurality of bi-layers by one of atomic layer deposition, sputtering, and evaporation.

Optionally, the inventive method further includes chemically etching the etched bi-layer stack with a second chemical etchant to generate a multiple-step structure on the substrate, wherein the second chemical etchant stops at the bulk layer.

Another embodiment of the invention includes a device. The device includes a substrate and a plurality of etalon optical cavities on the substrate. Each etalon optical cavity of the plurality of etalon optical cavities includes two mirrors sandwiching a bi-layer stack. The bi-layer stack includes a plurality of bi-layers. Each bi-layer of the plurality of bi-layers includes an etch stop layer and a bulk layer. The etch stop layer and the bulk layer are index-matched sufficiently close so as to permit multiple internal reflections within the each etalon optical cavity.

Optionally, the plurality of etalon optical cavities comprise a top surface roughness less than 3 nm root mean squared.

Optionally, the etch stop layer comprises alumina, and said bulk layer comprises silicon oxide.

The substrate includes a focal plane array, a CMOS imager, a CCD array, or a semiconductor device. Optionally, the focal plane array includes a plurality of sensor nodes. Optionally, the plurality of sensor nodes comprises a plurality of photodiodes.

Optionally, the two mirrors include a top mirror and a bottom mirror, wherein the top mirror or the bottom mirror includes a metal layer.

Optionally, the two mirrors include a top mirror and a bottom mirror, wherein the top mirror or the bottom mirror includes an adhesive and a metal layer.

Optionally, the two mirrors include a top mirror and a bottom mirror, wherein the top mirror or the bottom mirror includes a dielectric mirror.

Optionally, the two mirrors include a top mirror and a bottom mirror, wherein the top mirror or the bottom mirror includes a material boundary where reflection is due to differences in refractive index.

An embodiment of the invention allows micro-fabrication of optically flat steps with nanometer-scale height control with a single lithograph-etch step followed by a chemical etch step. Advantageously, the number of distinct levels achievable is independent from the number of lithograph steps and is independent of the number of resolvable grey-scale lithography levels. This allows for a quite simplified, cost-effective, and time-effective processing sequence.

An embodiment of the invention significantly simplifies the fabrication of such systems, while ensuring high quality optical cavities for such devices. Furthermore, an embodiment of the invention enables the fabrication of arrays of etalons with more distinct etalon levels than has been previously demonstrated in a single lithography step. Advantageously, in such an embodiment of the invention, the number of distinct etalon levels is limited by the precision of deposition processes (such as atomic layer deposition) rather than the precision of etch rates or pattern transfer.

An embodiment of the invention has at least three benefits. First, in this embodiment, only one lithograph step (i.e., gray-tone lithography) is required to define the ramp. The individual Etalon levels are made by the chemical etch step. Because only one lithograph step is required, this embodiment of the invention is time and cost effective. Furthermore, the risk of damaging the wafer is reduced because less processing steps are involved. Second, whereas gray-tone lithography alone can produce different levels but the number of distinct gray-levels is limited, the embodiment of the invention has greatly expanded the number of distinct gray-levels that are producible. One could not fabricate 1,000 levels with a gray-mask in a single exposure step. Third, after transferring the gray-scale resist into a dielectric the material surface will be rough; using an etch stop for each etalon leads to optically flat levels.

DETAILED DESCRIPTION OF THE INVENTION

Figure 2:
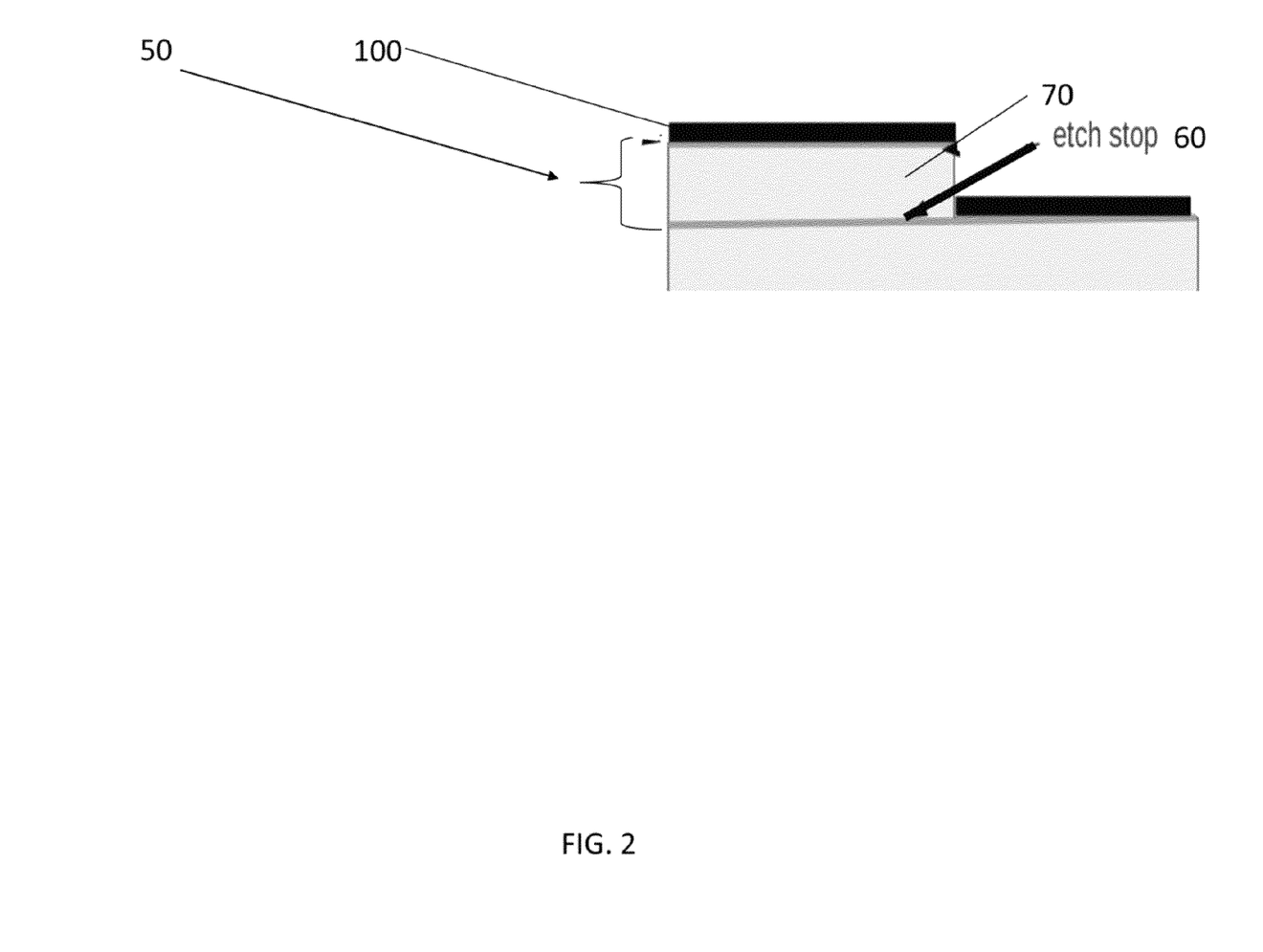
FIG. 2 is an illustrative, magnified, cross-sectional view of an illustrative bi-layer stack in the illustrative integrated optical device according to the instant invention.
Figure 3A:
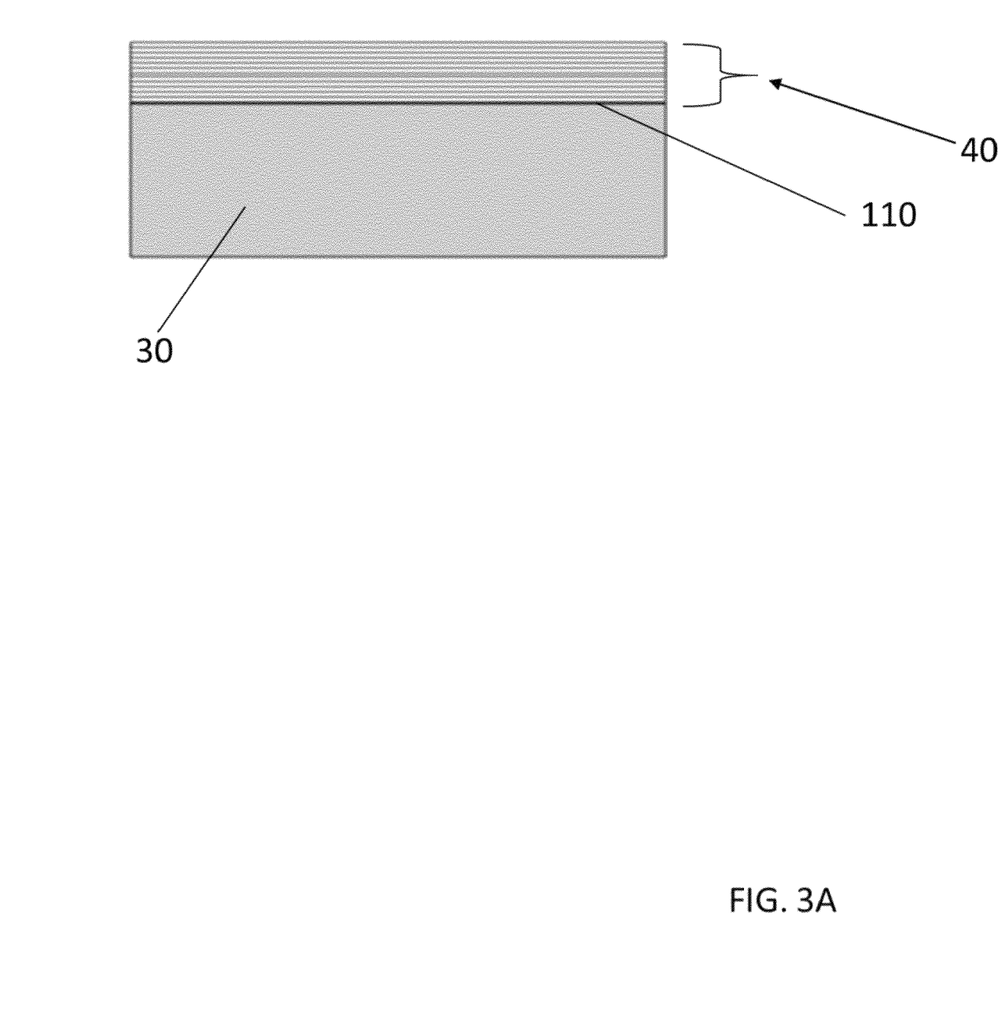
FIG. 3A is an illustrative cross-sectional view of bi-layer stack deposited on a substrate, according to an embodiment of the instant invention.
Figure 3B:
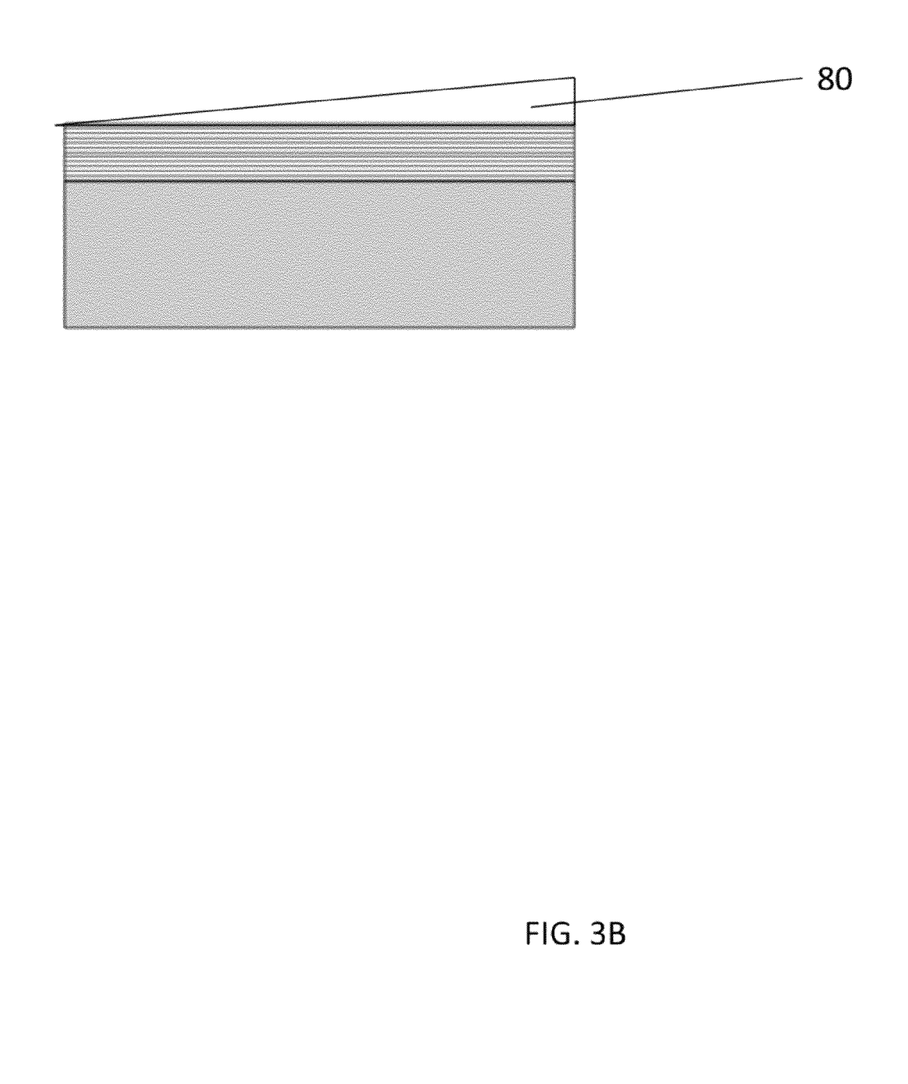
FIG. 3B is an illustrative cross-sectional view of a ramped photoresist deposited on the bi-layer stack, according to an embodiment of the instant invention.
Figure 3C:
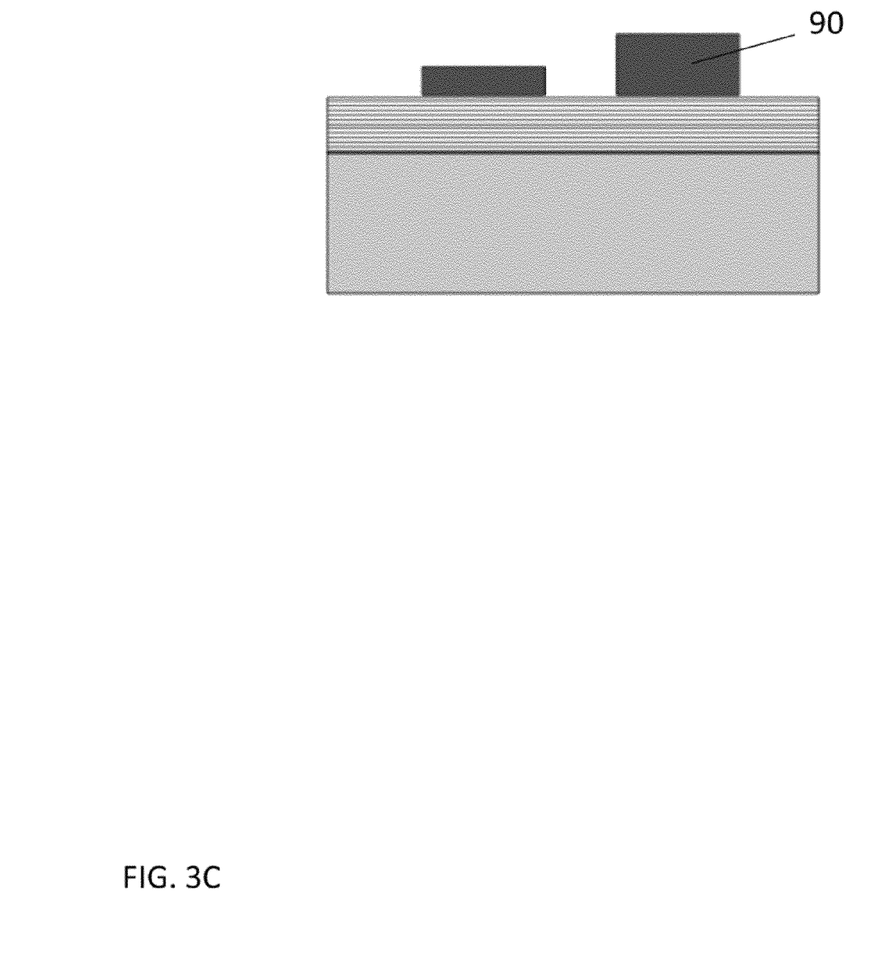
FIG. 3C is an illustrative cross-sectional view of a three-dimensional photoresist structure on the bi-layer stack, according to an embodiment of the instant invention.
Figure 3D:
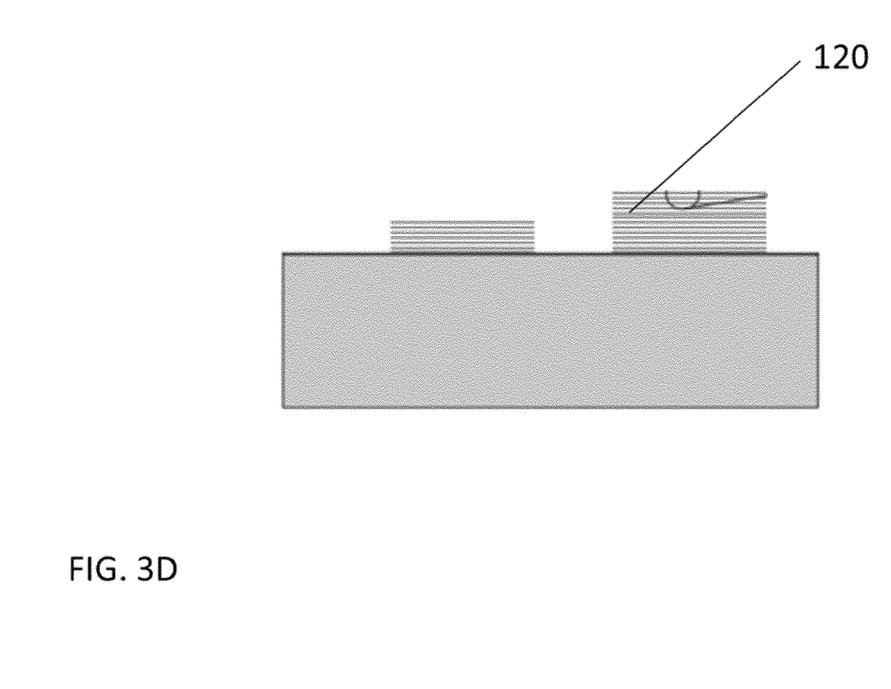
FIG. 3D is an illustrative cross-sectional view of the three-dimensional photoresist structure etched into the bi-layer stack.
Figure 3E:
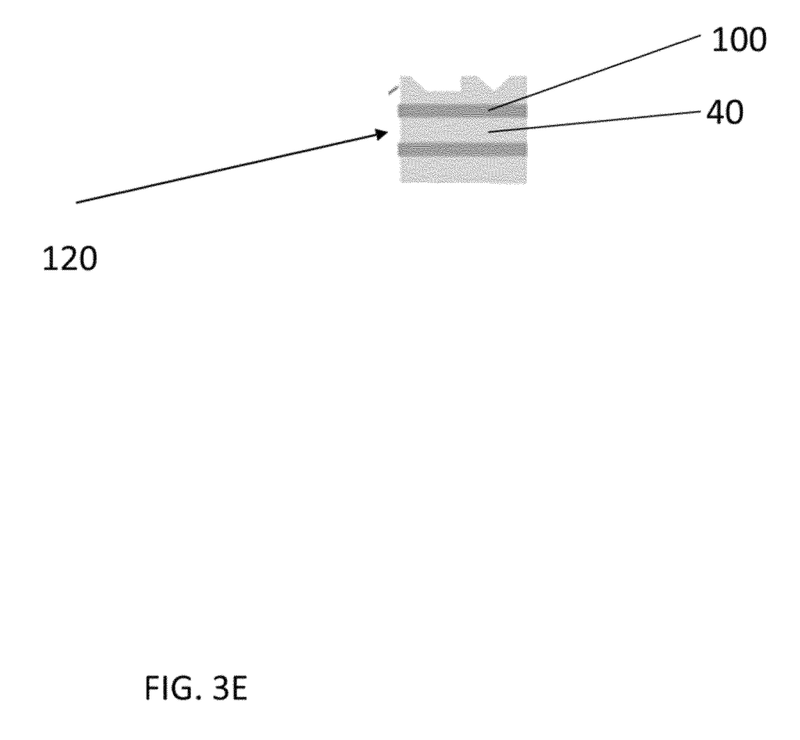
FIG. 3E is an illustrative cross-sectional view of a magnified portion of an etched bi-layer stack, according to an embodiment of the instant invention.
Figure 3F:
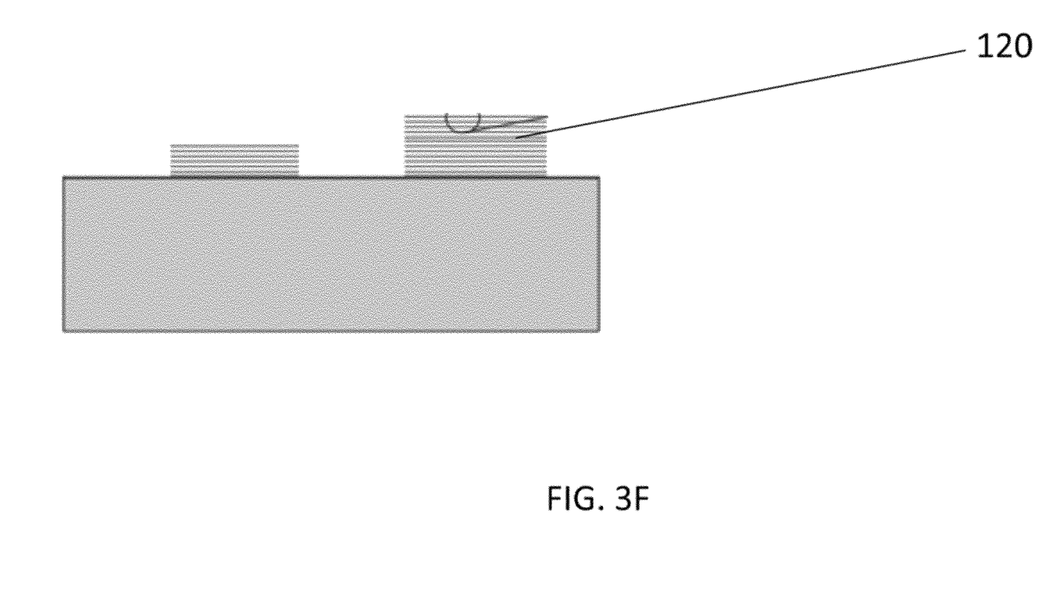
FIG. 3F is an illustrative cross-sectional view of a chemically etched multiple-level structure on the substrate, according to an embodiment of the instant invention.
Figure 3G:
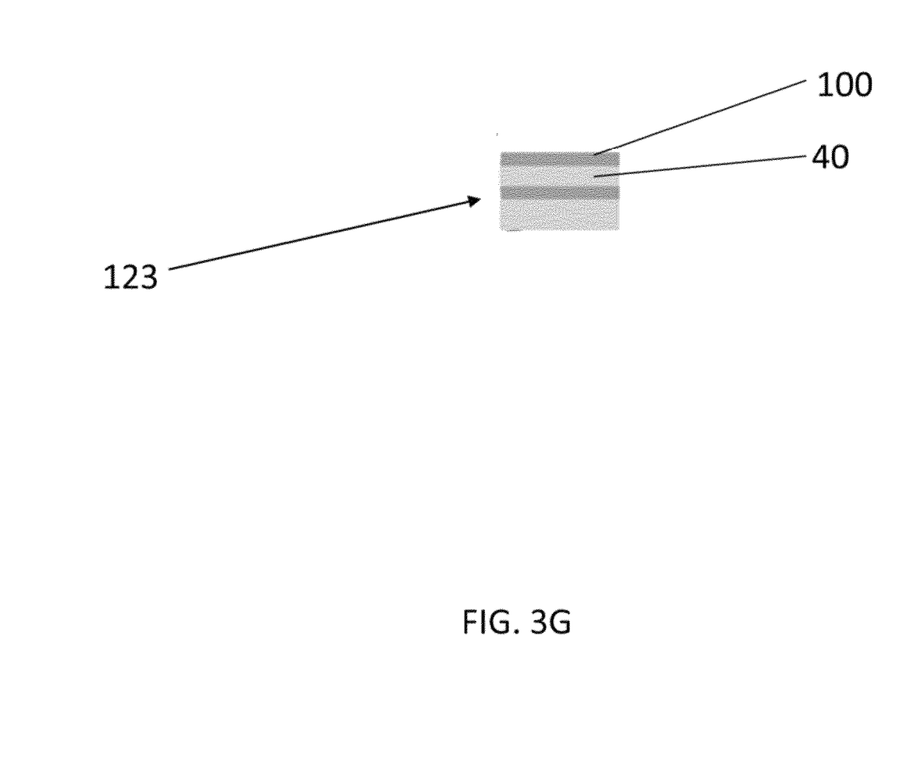
FIG. 3G is an illustrative cross-sectional view of a magnified portion of the multiple-level structure, according to an embodiment of the instant invention.

An embodiment of the invention includes a method of fabricating an integrated optical device 10. The integrated optical device includes a multiple-step structure 20 on a standard substrate 30, as shown in by way of illustration in FIG. 1. A bi-layer stack 40 is deposited in a standard process on the substrate 30, as shown in FIG. 3A. The bi-layer stack 40 includes a plurality of bi-layers, as shown by way of illustration in FIGS. 1 and 2. Each hi-layer 50 of the plurality of bi-layers includes an etch stop layer 60 and a bulk layer 70. The bulk layer 70 is on top of the etch stop layer 60, or vice versa, depending on the application. Standard photoresist 80 is deposited on the bi-layer stack 40, as shown by way of illustration in FIG. 3B. The standard photoresist 80 includes standard negative photoresist or standard positive photoresist. Examples of acceptable standard negative photoresist or standard positive photoresist that are used in gray-tone lithography include DNQ-Novolac photoresist and epoxy-based polymer resists. A three dimensional photoresist structure 90 is formed by using standard gray-tone lithography, as shown by way of illustration in FIG. 3C. For example, the gray-tone lithography uses a standard High Energy Beam Sensitive ("HEBS") glass mask or a standard optical diffuser and a standard contact aligner. The three dimensional photoresist structure 90 is plasma etched in a standard plasma etch process into the bi-layer stack, thereby generating an etched bi-layer stack 120, as shown by way of illustration in FIGS. 3D and 3E. For example, the etched bi-layer stack includes contiguous or discontiguous ramp. FIG. 3E shows by way of illustration a representative, magnified portion of the etched bi-layer stack 120. The etched bi-layer stack is chemically etched with a first chemical etchant to generate a multiple-step structure 120 on the substrate, wherein the first chemical etchant stops at the etch stop layer, as shown by way of illustration in FIGS. 3F and 3G. For example, the first chemical etchant turns the contiguous or discontiguous ramp into a staircase or a plurality of mesas. FIG. 3G shows by way of illustration a representative, magnified portion of the multiple-step structure 120, for example, with an optically smooth, top surface.

Optionally, the etch stop layer 60 comprises alumina, and the bulk layer 70 comprises silicon oxide. Alternatively, other dielectric materials could be used, for example, etch stop layers including metal oxides or bulk layers including amorphous silicon. The only requirement for acceptable alternative dielectric materials is that one material can be selectively etched with respect the other one.

Optionally, the first chemical etchant comprises vaporous hydrofluoric acid. Alternatively, different standard, wet or dry (reactive ion etch) techniques can be used, depending on the materials chosen for the etch stop layer and the bulk layer. For example, fluorine-based RIE recipes to selectively etch silicon dioxide vs. alumina have been published.

Optionally, plasma etching the three dimensional photoresist 90 into the bi-layer stack 40 uses standard fluorine-based plasma chemistry.

Optionally, the multiple-step structure 120 comprises a number of individual steps. Optionally, the number of individual steps is larger than twenty, and preferably larger than one hundred. The dimensions of the individual steps are selected to avoid undercutting during etching. As an example of the dimensions of the steps, the run or tread of an individual step is at least ten times greater in length than the riser of the individual step. For instance, the tread of the individual step is 25 μm, and the riser of the individual step is 10 nm.

Optionally, the substrate 30 is a standard semiconductor with integrated circuits. Optionally, the standard semiconductor is a standard imager.

Optionally, the substrate is a standard focal plane array comprising a plurality of standard sensor nodes.

Optionally, depositing a bi-layer stack includes depositing the plurality of bi-layers by one of standard atomic layer deposition, standard sputtering, and standard evaporation.

Optionally, the inventive method further includes chemically etching the etched bi-layer stack with a second chemical etchant, wherein the second chemical etchant stops at the bulk layer.

Figure 1:
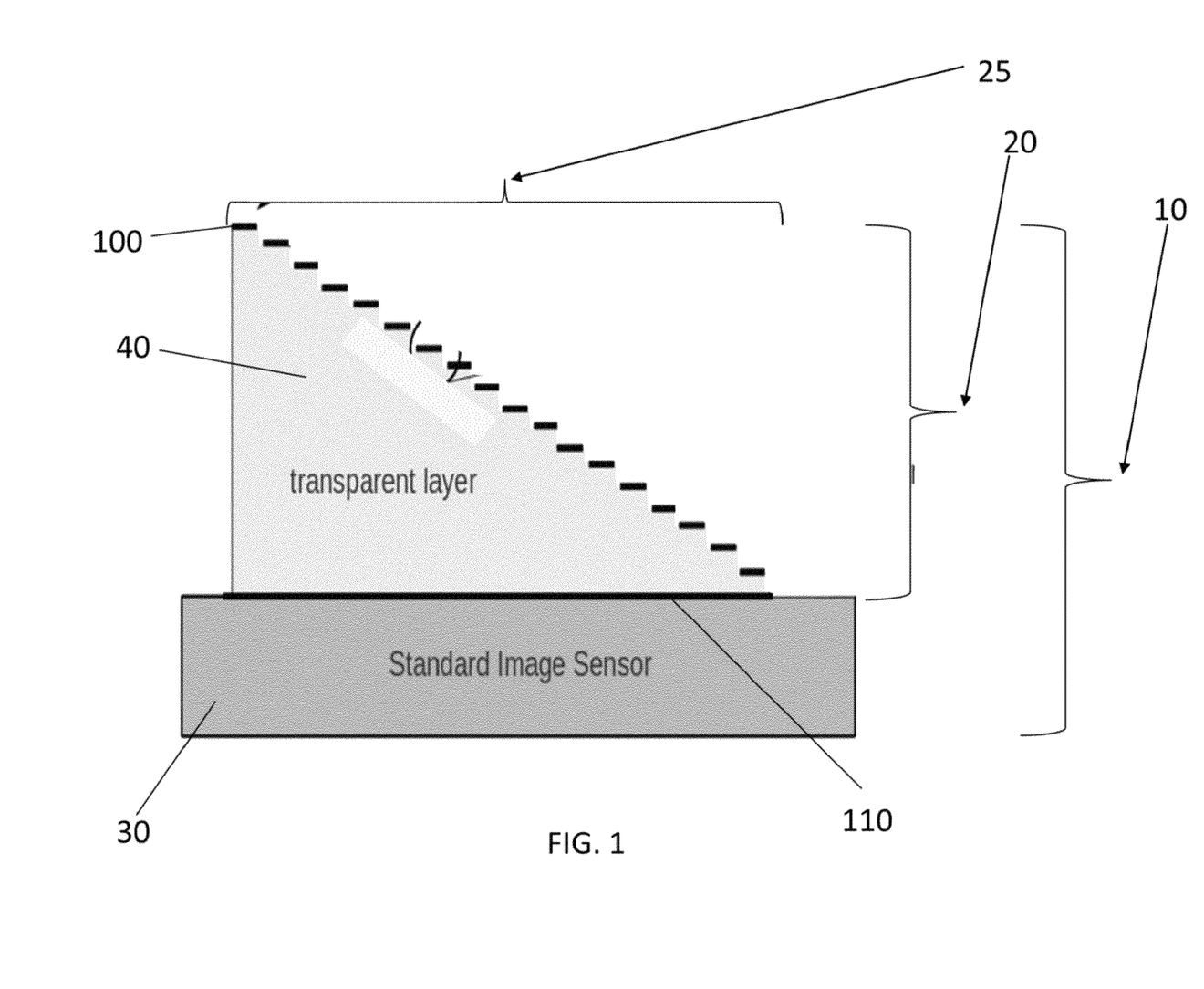
FIG. 1 is an illustrative cross-sectional view of an illustrative integrated optical device according to the instant invention.

Another embodiment of the invention includes an integrated optical device 10. The device 10 includes a substrate 30 and a plurality of etalon optical cavities 25 on the substrate 30. Optionally, the etalon cavities are separate mesas. Optionally, the etalon cavities adjoin, thereby forming a staircase. Each etalon optical cavity of the plurality of etalon optical cavities includes two mirrors 100, 110 sandwiching a bi-layer stack. The bi-layer stack 20 includes a plurality of bi-layers. For example, the plurality of bi-layers includes at least twenty bi-layers. For example, the plurality of bi-layers includes at least one hundred bi-layers. Each bi-layer 50 of the plurality of bi-layers includes an etch stop layer and a bulk layer. The etch stop layer 60 and the bulk 70 layer are index-matched sufficiently close so as to permit multiple internal reflections within the each etalon optical cavity.

Optionally, the plurality of etalon optical cavities comprise a top surface roughness less than 3 nm root mean squared. Optionally, the top surface roughness is less than 1 nm root mean squared.

Optionally, the etch stop layer 60 comprises alumina, and the bulk layer 70 comprises silicon oxide.

The substrate 30 includes, for example, a standard focal plane array, a standard CMOS imager, a standard CCD array, or a standard semiconductor device. Optionally, the standard focal plane array includes a plurality of standard sensor nodes. Optionally, the plurality of standard sensor nodes comprises a plurality of standard photodiodes.

Optionally, the two mirrors include a standard top mirror 100 and a standard bottom mirror 110, wherein the top mirror or the bottom mirror includes a standard reflective metal layer such as gold, silver, or platinum. As an example, the mirrors have thicknesses on the order of nanometers. The top mirror's thickness is optionally the same, greater than, or less than the bottom mirror's thickness.

Optionally, the two mirrors include a top mirror and a bottom mirror, wherein the top mirror or the bottom mirror includes a standard adhesive and a standard reflective metal layer such as gold.

Optionally, the two mirrors include a top mirror and a bottom mirror, wherein the top mirror or the bottom mirror includes a standard dielectric mirror.

Optionally, the two mirrors include a top mirror and a bottom mirror, wherein the top mirror or the bottom mirror includes a material boundary where reflection is due to differences in refractive index.

Another embodiment of the invention employs gray-tone lithography on a bi-layer stack, as shown in FIGS. 3A-3G. Whereas standard lithography generates a "black-white" image with a distinct top-down, two-level profile, gray-tone lithography can generate full three-dimensional ("3-D") resist structures like ramps. The variability of photoresist exposure and development in grey-tone lithography can be partially mitigated to create smooth photoresist structures.

The 3-D resist structure can be transferred by a reactive ion etching ("RIE") step into almost any type of material. In this embodiment of the instant invention, a gray-tone resist ramp 30 is transferred into a bi-layer stack a few hundred nanometers to several micrometers thick.

After the RIE step, a roughened surface remains due to variability in material and photoresist homogeneity, and the random nature of the etch process. This has historically limited the resolvable grey-tone levels. However, in a process according to the instant embodiment, a chemical etch then digitizes the levels. Each bilayer is comprised of two dielectric materials, wherein one material acts as a bulk layer 70, and one material acts as a chemical etch stop layer 30. The bulk layer 70 etches quickly, and the etch stop layer 60 etches very slowly when exposed to the same etch process. The etch stop layer 60 of each bilayer defines these individual levels. (Alternatively, the RIE step and the chemical etching step are combined into a single RIE etch step, which would require the reactive ion etching to have a high etch selectivity as between the bulk layer and the etch stop layer.)

The bi-layer stack can be deposited by any one of a number of standard thin film deposition techniques, such as PECVD, plasma-enhanced chemical vapor deposition, and atomic layer deposition. The bi-layer stack is comprised of two materials, a bulk material and an etch stop material. The bulk material is always deposited on top of the etch stop material; the bi-layer stack is comprised of multiple etch stop-bulk bi-layers. The optical properties of bulk material and etch stop material need to match the application. The number of etalon levels is determined by the number of bi-layers within the stack and the geometry of the gray-tone photoresist structure.

Applicants recognized that gray-tone lithography is ideal for the fabrication of 3-D micro-structures. Gray-tone lithography (also known as gray-scale lithography) is a specialized lithography process which results in continuously variable resist profiles. A gray-tone optical mask is used to transmit only a portion of the intensity of incident light, partially exposing sections of a positive photoresist to a certain depth. This exposure renders the top portion of the photoresist layer more soluble in a developer solution, while the bottom portion of the photoresist layer remains unchanged. The number of resolvable levels in grey-tone lithography has been limited by photoresist exposure nonlinearity, variability in development and material homogeneity to less than 100 levels under common conditions. With careful attention to detail, it is possible to achieve grey-tone lithography resolution of up to 200 levels. Continuous structures can be produced by heating the photoresist to smooth out surface non-uniformity.

Applicants further recognized that the developed photoresist can be processed, for example, by etching to reproduce a scaled version of the three dimensional structure on the substrate. As the etch proceeds, the photoresist mask slowly erodes, exposing the underlying dielectric to the high etch rate plasma. Thus, gray-scale technology relies on RIE recipes that control "etch selectivity," which is the relative etch rate of the bi-layer stack to photoresist. This aspect defines the final vertical dimensions of a 3D structure. It is possible that the transferred pattern be of any scaled ratio to the photoresist. RIE etching, is known to create surface non-uniformities, due to the random nature of the etching process and material inhomogeneity.

After transferring the gray-tone resist into the stack a chemical etch step is performed. The chemical selectively only etches one material of the bi-layer (e.g. when the bulk layer 70 is etched, whereas the etch stop layer 60 is not). This selective chemical etch step will transform the ramp into distinct levels. As an example, in this embodiment of the invention, vapor hydrofluoric acid ("HF") to etch $SiO_2$ selectively over the $Al_2O_3$. This leads to digitally distinct levels at a resolution controlled by the deposition of the bilayer stack. Applicants recognized that optical flatness, for example, is improved due to the chemical etch step.

An embodiment of the invention includes silicon dioxide/alumina bi-layers, and commercially available four inch silicon and quartz wafers as substrates. The top and bottom mirrors included thin e-beam evaporated gold layers (e.g., of 10 nm thickness), wherein a chrome layer (e.g., of 2 nm thickness) was used to promote gold adhesion. Alternatives to chrome for a gold adhesion purposes include titanium. The silicon dioxide bulk layers were ~330 nm thick and were deposited by PECVD. The alumina etch stop layers were ~15 nm and deposited by Atomic Layer Deposition.

In this embodiment of the invention, the gray-tone lithography employs a Novolak resist (e.g., AZ P4330 buffered KOH developer from Clariant Corporation, ~6 µm thick). According to standard soft-bake procedure, the wafer is heated to 100° C. for 60 seconds on a hotplate in order to drive solvents out of the resist prior to UV exposure. A standard High Energy Beam Sensitive ("HEBS") gray-level standard mask. The resist is exposed for 10 seconds with the HEBS mask. Alternatively, instead of using a HEBS mask, another embodiment of the invention employs "diffuser-based" gray-tone lithography, using a 15 second exposure time. According to standard development procedure the resist is developed using a standard puddle method. 1:4 DI water to 400K AZ buffered KOH developer is used for ~40 sec which is followed by a sound de-ionized ("DI") water rise. After development the resist is hard-baked at 150° C. for 120 seconds. The hard-bake makes the resist more resistant during the RIE etching step.

In this embodiment of the invention, the gray-tone resist patterns is transferred into the stack via an ICP (induction coupled plasma) RIE etch process step. The ICP etch is performed using an Oxford 100 fluorine etcher (30 sccm $CF_4$, 20 mTorr, 20 W forward power, 500 W ICP power, 90 min etch time).

In this embodiment of the invention, vapor HF is used for the chemical etch step. HF vapor only etches the silicon oxide. Alumina is not etched by HF vapor. HF reacts with $SiO_2$ and forms water. HF (aqueous), on the other hand, does etch alumina. Commercial HF vapor etch systems do minimize the formation of HF (aqu.) by injecting alcohol into the system. The integrated optical device being fabricated is placed on top of a HF filled beaker at room temperature. The etch time was 60 seconds. After HF vapor etching the sample is rinsed with DI-water. After the vapor HF etching, three distinct levels are clearly visible.

Optically flat surfaces are achieved using this embodiment of the invention. This structure is created using the aforementioned HEBS mask (or the optical diffuser and contact aligner) yielding an optically flat alumina top surface. In other words, a gray-tone resist ramp was used to create isolated optically flat isolated mesas. Alternatively, a gray-tone resist ramp is used to create staircases, i.e. mesas with no physical separations. Other structures that can be fabricated using the instant embodiment of the invention include depressions, columns, gratings, and MEMS components.

This written description sets forth the best mode of the invention and provides examples to describe the invention and to enable a person of ordinary skill in the art to make and use the invention. This written description does not limit the invention to the precise terms set forth. Thus, while the invention has been described in detail with reference to the examples set forth above, those of ordinary skill in the art may effect alterations, modifications and variations to the examples without departing from the scope of the invention.

These and other implementations are within the scope of the following claims.

What is claimed as new and desired to be protected by Letters Patent of the United States is:

1. A method of fabricating a multiple-step structure on a substrate, the method comprising:
   depositing a bi-layer stack on a substrate, the bi-layer stack comprising a plurality of bi-layers, each bi-layer of the plurality of bi-layers comprising an etch stop layer and a bulk layer;
   forming a three dimensional photoresist structure by using gray-tone lithography;
   plasma etching the three dimensional photoresist into the bi-layer stack, thereby generating an etched bi-layer stack; and
   chemically etching the etched hi-layer stack with a first chemical etchant to generate a multiple-step structure on the substrate, wherein the first chemical etchant stops at the etch stop layer.

2. The method according to claim 1, wherein the etch stop layer comprises alumina, and the bulk layer comprises silicon oxide.

3. The method according to claim 1, wherein the first chemical etchant comprises vaporous hydrofluoric acid.

4. The method according to claim 1, wherein said plasma etching the three dimensional photoresist into the bi-layer stack comprises fluorine-based plasma chemistry.

5. The method according to claim 1, wherein the multiple-step structure comprises a number of individual steps, the number of individual steps being larger than twenty.

6. The method according to claim 1, wherein the substrate is a semiconductor with integrated circuits.

7. The method according to claim 1, wherein the substrate is a focal plane array comprising a plurality of sensor nodes.

8. The method according to claim 6, wherein said semiconductor is an imager.

9. The method according to claim 1, wherein said depositing a bi-layer stack comprises depositing the plurality of bi-layers by one of atomic layer deposition, sputtering, and evaporation.

10. The method according to claim 1, further comprising:
    chemically etching the etched bi-layer stack with a second chemical etchant to generate a multiple-step structure on the substrate, wherein the second chemical etchant stops at the bulk layer.

11. A device comprising:
    a substrate; and
    a plurality of etalon optical cavities on said substrate, each etalon optical cavity of said plurality of etalon optical cavities comprising two mirrors sandwiching a bi-layer stack, said bi-layer stack comprising a plurality of bi-layers, each bi-layer of said plurality of bi-layers comprising an etch stop layer and a bulk layer, wherein said etch stop layer and said bulk layer are index-matched sufficiently close so as to permit multiple internal reflections within said each etalon optical cavity.

12. The device according to claim 11, wherein said etalon cavities comprise a top surface roughness less than 3 nm root mean squared.

13. The device according to claim 11, wherein said etch stop layer comprises alumina, and said bulk layer comprises silicon oxide.

14. The device according to claim 11, wherein said substrate comprises one of a focal plane array, a CMOS imager, a CCD array, and a semiconductor device.

15. The device according to claim 14, wherein said focal plane array comprises a plurality of sensor nodes.

16. The device according to claim 15, wherein said plurality of sensor nodes comprises a plurality of photodiodes.

17. The device according to claim 1, wherein said two mirrors comprise a top mirror and a bottom mirror, one of said top mirror and said bottom mirror comprising a metal layer.

18. The device according to claim 1 wherein said two mirrors comprise a top mirror and a bottom mirror, one of said top mirror and said bottom mirror comprising an adhesive and a metal layer.

19. The device according to claim 1 wherein said two mirrors comprise a top mirror and a bottom mirror, one of said top mirror and said bottom mirror comprising a dielectric mirror.

20. The device according to claim 11, wherein said two mirrors comprise a top mirror and a bottom mirror, one of said top mirror and said bottom mirror comprising a material boundary where reflection is due to differences in refractive index.

* * * * *